US006054870A

United States Patent [19]

Urano et al.

[11] Patent Number: 6,054,870

[45] Date of Patent: Apr. 25, 2000

[54] LIQUID CRYSTAL DEVICE EVALUATION METHOD AND APPARATUS

[75] Inventors: Taeko Urano; Shigeru Machida, both of Kawasaki; Kenji Sano, Tokyo, all of Japan

[73] Assignee: Kabushiki Kaisha Toshiba, Kawasaki, Japan

[21] Appl. No.: 08/981,832

[22] PCT Filed: May 16, 1997

[86] PCT No.: PCT/JP97/01651

§ 371 Date: Jan. 16, 1998

§ 102(e) Date: Jan. 16, 1998

[30] Foreign Application Priority Data

May 16, 1996 [JP] Japan .................................... 8-121917

[51] Int. Cl.[7] .................................................... G01R 31/00

[52] U.S. Cl. ........................................ 324/770; 324/158.1

[58] Field of Search ................................ 324/770, 158.1, 324/73.1, 719, 765

[56] References Cited

U.S. PATENT DOCUMENTS 5,621,334 4/1997 Urano et al. ............................ 324/770

FOREIGN PATENT DOCUMENTS 5-66376 3/1993 Japan .
6-110027 4/1994 Japan .
8-262385 10/1996 Japan .
9-105703 4/1997 Japan .

OTHER PUBLICATIONS

K. Iwata and H. Hamaguchi, "Construction of a Versatile Microsecond Time–Resolved Infrared Spectrometer", Applied Spectroscopy, vol. 44, Nov. 9, 1990, pp. 1431–1437.

*Primary Examiner*—Josie Baliato
*Assistant Examiner*—T. R. Sundaram
*Attorney, Agent, or Firm*—Oblon, Spivak, McClelland, Maier & Neustadt, P.C.

[57] ABSTRACT

Impurities mixed in the liquid crystal device are detected by a method comprising the steps of applying a DC electric field to a liquid crystal device having a liquid crystal layer between a pair of electrodes, and irradiating the liquid crystal device with light within a specific wavelength, while an AC pulsed electric field is being applied to the liquid A crystal device after the DC electric field is removed to obtain a field response curve corresponding to time-dependent change of light intensity during a cycle of the AC pulsed electric field by time-resolved measurement of light passed through the liquid crystal layer, wherein the impurities are detected on the basis of specific quantitative change in the electric field response curve as a function of elapsed time after the DC electric field is removed.

2 Claims, 2 Drawing Sheets

LIQUID CRYSTAL DEVICE EVALUATION METHOD AND APPARATUS

TECHNICAL FIELD present invention relates to a liquid crystal device evaluation method and apparatus, and more particularly, to a method and apparatus for detecting impurities mixed in a liquid crystal device.

BACKGROUND ART

In a liquid crystal device, if impurities responsive to an electric field (hereinafter referred to as "field responsive impurities") are mixed in a liquid crystal, the device performance, such as a response speed and contrast, deteriorates and the service life of the device shortens. The field responsive impurities are defined as chemical species capable of moving or transporting electric charges within the device upon application of the electric field. The field responsive impurities include protons, organic ions, inorganic ions, compounds having a hydrogen bonding ability, compounds having an electron transporting ability, compounds having a large dipole moment, compounds having a large polarizability, and the like. It is therefore indispensable to improve the manufacturing process in order to prevent contamination of the device with the field responsive impurities by detecting, identifying, and determining them mixed in the device. At this time, to properly determine which one of processes should be modified and how to modify it, the identification of the mixed impurities will be important.

To evaluate impurities, a method of measuring a voltage retention ratio of the liquid crystal device at high temperature has been conventionally employed. This method enables to evaluate the liquid crystal device in the final state of the construction thereof. However, this method requires much time and labor. In addition, it is difficult to specify causative materials for impurities and a process in which impurities are mixed in the liquid crystal device.

It is an object of the present invention to provide a liquid crystal evaluation method capable of identifying field responsive impurities contained in a liquid crystal device simply and with high sensitivity, and an apparatus for realizing the evaluation method.

DISCLOSURE OF INVENTION

A method of evaluating a liquid crystal device according to the present invention, comprises the steps of:

applying a DC electric field to a liquid crystal device having a liquid crystal layer between a pair of electrodes;

irradiating the liquid crystal device with light within a specific wavelength while an AC pulsed electric field is being applied to the liquid crystal device after the DC electric field is removed to obtain a field response curve corresponding to time-dependent change of light intensity during a cycle of the AC pulsed electric field by time-resolved measurement of light passed through the liquid crystal layer;

wherein impurities mixed in the liquid crystal device are detected on the basis of specific quantitative change in the field response curve as a function of elapsed time after the functional electric field is removed.

A liquid crystal device evaluation apparatus of the present invention comprises:

means for applying a DC electric field to a liquid crystal device having a liquid crystal layer between a pair of electrodes;

means for applying an AC pulsed electric field to the liquid crystal device;

means for controlling an AC pulsed electric field so as to be applied after the DC electric field is removed;

a light source for irradiating the liquid crystal layer with light;

spectroscopic means for extracting light within a specific wavelength range from the light radiated from the light source;

light detection means for converting the light within a specific wavelength range passed through the liquid crystal layer into an electric signal after the light is extracted by the spectroscopic means from the light radiated from the light source;

means for obtaining a field response curve corresponding to time-dependent change of light intensity during a cycle of the AC pulsed electric field by time-resolving and integrating the electric signal converted by the light detection means; and means for calculating specific quantitative change in the field response curve and analyzing the quantitative change as a function of elapsed time after the DC electric field is removed.

BEST MODE OF CARRYING OUT THE INVENTION

Figure 1:
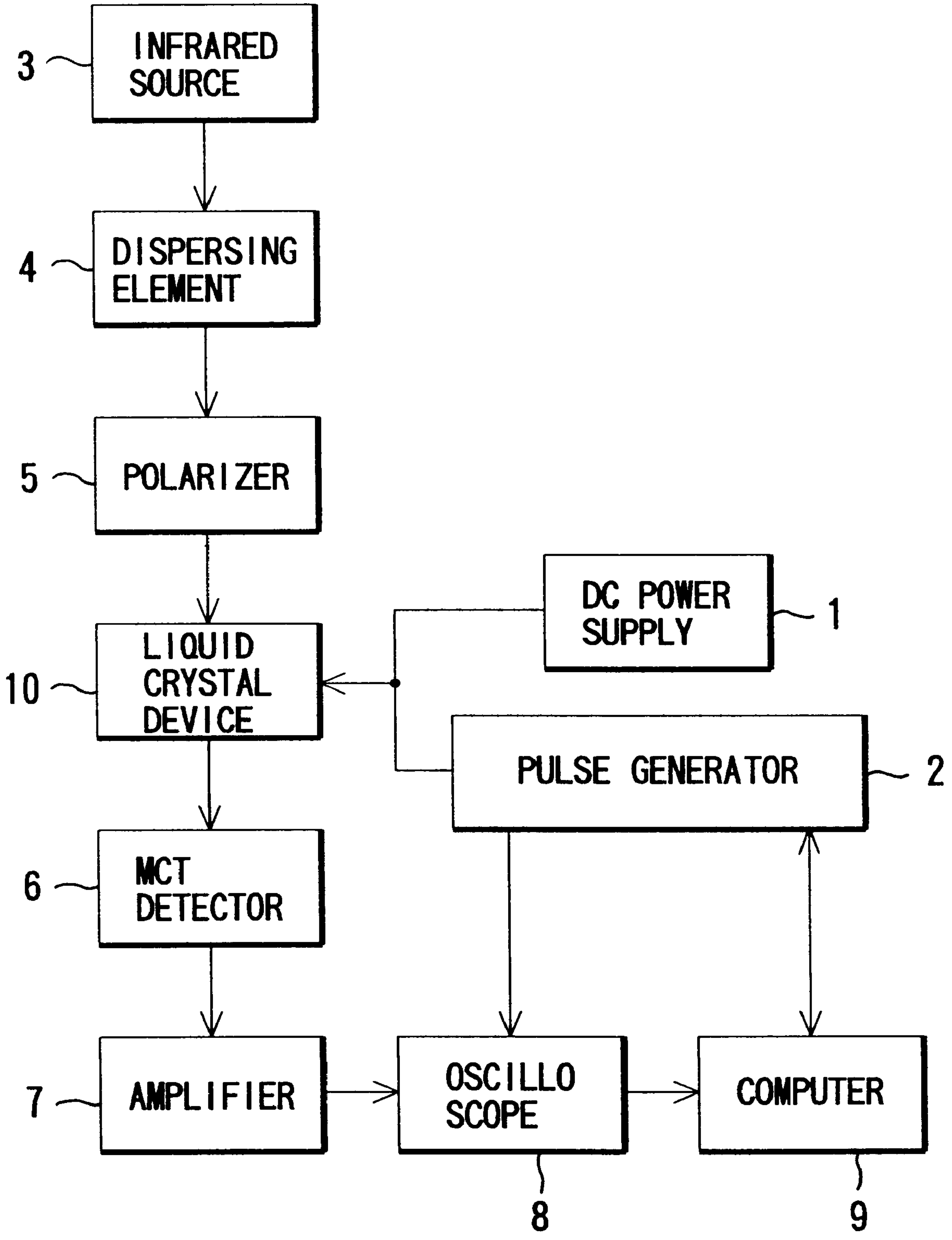
FIG. 1 is a block diagram showing an example of a liquid crystal device evaluation apparatus of the present invention.

First, the principle of the present invention will be briefly described.

When an electric field is applied to a liquid crystal device having a liquid crystal layer between a pair of electrodes, liquid crystal molecules are aligned in the direction of the electric field. At this time, if field responsive impurities are mixed in the liquid crystal, the magnitude of an effective electric field applied to the liquid crystal molecules changes, as compared to the liquid crystal not contaminated with impurities. Such a change consequently influences upon the orientation movement of liquid crystal molecules. Therefore, when an AC pulsed electric field is applied to the liquid crystal molecules as described later and a field response curve representing the state of the orientation movement is measured, the field responsive impurities can be detected by comparison with the field response curve of the liquid crystals not contaminated with field responsive impurities. In the meantime, it has been found that in the case where the field responsive impurities are present uniformly in the liquid crystal, in other words, in the case where the amount of impurities near an electrode is low, the detection sensitivity is not high enough. Then, in the present invention, a functional electric field is applied to the liquid crystal device before the field response curve is measured in order to transfer field responsive impurities in the liquid crystal near one of the electrodes. After the DC electric field is removed, the field responsive impurities diffuse gradually, with the result that the field response curve changes with a passage of time. If such a specific quantitative change in the field response curve is checked after the DC electric field is removed, the field responsive impurities can be detected with high sensitivity.

Hereinbelow, the method of the present invention will be explained in detail. A DC electric field, more specifically, a direct current (DC) electric field, is continuously applied to the liquid crystal device having a liquid crystal layer between a pair of electrodes. The reason why the DC electric field is used is that the DC electric field is the most preferable to transfer the field responsive impurities near one of the electrode. In this step, the field responsive impurities mixed in the liquid crystal can be transferred near one of electrodes. The magnitude of the DC electric field is sufficient as long as it can transfer the field responsive impurities. It is preferable that the application time fall within 60 minutes. If the application time is excessively long, it will take a longer time to complete measurement. In addition, the liquid crystal is influenced by the long application and changed into ionic impurities. However, if the amount of the field responsive impurities is low, it is preferable that the application time be as long as possible within 60 minutes, in view of increasing detection sensitivity. Note that the applied voltage need not have a constant value.

After the DC electric field is removed, field response curves are measured at certain time intervals or continuously. More specifically, light within a specific wavelength range which can be absorbed by the liquid crystal molecules, is irradiated on the liquid crystal device while keeping the aligned state of the liquid crystal molecules by applying AC pulsed field to the liquid crystal device, thereby detecting intensity of the light of a specific wavelength passed through the liquid crystal layer. Then, the electric signal corresponding to the light intensity is time-resolved and then integrated. In this manner, the field response curve of light intensity within a cycle of the AC pulsed electric field is obtained. Since the degree of light absorption by the liquid crystal molecules varies depending upon the orientation state of the liquid crystal molecules, the field response curves determined on the basis of intensity of light passed through the liquid crystal layer correspond to the change of the orientation state of the liquid crystal molecules with a passage of time. When the field responsive impurities having a predetermined polarity are present in the liquid crystal layer, the magnitude of the effective electric field to be substantially applied to the liquid crystal molecules is reduced or increased depending upon the polarity of the AC pulsed electric field. As a result, the orientation state of the liquid crystal molecules changes. Therefore, the field response curve of the liquid crystal device including the field responsive impurities differs in slope between before and after the polarity of the AC pulsed electric field is reversed, as compared to that of the liquid crystal device not contaminated with impurities. The manner of change in slope of the field response curve varies depending on type and amount of impurities.

As the light to be irradiated on the liquid crystal device in this step, infrared light is particularly preferred in view of sensitivity when the field response curve is measured. As the wavelength range of the light, a wavelength range containing an infrared absorption band assigned to CH stretching vibration and CN stretching vibration of the liquid crystal molecules (for example, 2225 $cm^{-1}$ in latter case) is selected. Such light within a specific wavelength range can be extracted by dispersing light radiated from a light source by an arbitrary spectroscopic means. In this case, light outside the specific wavelength range is not irradiated on the liquid crystal device, so that an increase in temperature of the liquid crystal device can be suppressed. As the light to be detected, light transmitted through the liquid crystal device and light reflected by the liquid crystal device, may be used.

The waveform of the AC pulsed electric field used in this step is not limited. A rectangular, triangular, sine wave, and a combined wave thereof may be used. The manner of change in slope of the field response curve differs depending upon the pulse width of the AC electric field applied. In addition, the manner of change depending upon the pulse width is specific to individual impurities. Hence, if the field response curve is determined by changing the pulse width of the AC pulse electric field, it is possible to obtain useful information for specifying impurities mixed in the liquid crystal layer. Furthermore, if a combined AC pulsed electric field, which is a combination of a plurality of pulse sequences different in pulse width, is applied and the field response curve corresponding to each of pulse sequences constituting the combined AC pulsed electric field is determined, a plurality of impurities mixed in the liquid crystal device can be specified.

Furthermore, in the present invention, after the DC electric field is removed, the field response curves are determined with a passage of time as mentioned above. From the results, it is possible to obtain specific quantitative change in the field response curve with a passage time after the DC electric field is removed. However, the specific quantitative change herein is not particularly limited. Any quantitative change is employed as long as it is measured by a definite criteria. For example, a slope of the curve, a function form thereof, and difference from the field response curve obtained with respect to the liquid crystal device not contaminated with impurities, may be mentioned. As mentioned above, after the DC electric field is removed, the field responsive impurities concentrated in the vicinity of an electrode diffuse gradually. Therefore, when the change in the field response curve with a passage of time is checked after the DC electric field is removed, the specific quantitative change is gradually attenuated. Thus, on the basis of the attenuation of the specific quantitative change with a passage of time in the field response curve, detection of the field responsive impurities mixed in the liquid crystal layer can be made with high sensitivity. Furthermore, since the manner of the attenuation varies depending upon how the impurities diffuse, useful information to specify type of impurities can be obtained.

Now, an evaluation apparatus of the liquid crystal device according to the present invention will be explained. As described above, the evaluation apparatus of the present invention comprises means for applying a DC electric field to the liquid crystal device; means for applying an AC pulsed electric field to the liquid crystal device; a light source; a spectroscopic means; light detection means for converting light in a specific wavelength range passed through the liquid crystal layer to an electric signal; means for obtaining a field response curve corresponding to change in light intensity with a passage of time during a cycle of the AC pulsed electric field by time-resolving and integrating the electric signal converted by the light detection means; and means for calculating a specific quantitative change in the field response curve and analyzing the quantitative change as a function of elapsed time after the DC field is removed.

The same apparatus may be used as the means not only for applying the DC electric field but also for applying the AC pulsed electric field by controlling the apparatus.

As the light source, an infrared source is preferably used as described above. As the spectroscopic means, an arbitrary spectroscope (dispersive device) such as a grating, a prism, or an interference filter, is used. In view of suppressing an increase in temperature of the liquid crystal device, it is preferable that light from the light source be dispersed and irradiated on the liquid crystal device by disposing the spectroscopic means. between the light source and the liquid crystal device. It is further preferable that a polarizer be provided between the spectroscopic means and the liquid crystal device to irradiate the liquid crystal device with polarized light whose polarization direction corresponds to the longer axis of the aligned liquid crystal molecules. As the light detecting means, an MCT (mercury-cadmium-telluride) detector, which is a highly sensitive detector among the infrared detectors. When infrared light is used as light to be detected, the infrared light is converted into an electric signal, which is usually amplified by an amplifier, since the detected infrared light is weak in intensity.

As the means for determining the field response curve by time-resolving and integrating the electric signal converted by the light detecting means, a boxcar integrator or a digital sampling oscilloscope, may be used.

A computer is used as the means for calculating specific quantitative change in the field response curve and analyzing the quantitative change as the function of elapsed time after the DC electric field is removed.

As mentioned above, to identify a plurality of impurities mixed in the liquid crystal device, a combined AC pulsed electric field, which is a combination of pulse sequences different in pulse width, may be applied by the AC pulsed electric field apply means, and the electric signal converted by the infrared light detector may be demodulated to electric signal components corresponding to the respective pulse sequences constituting the combined AC pulse electric field.

Examples of the present invention will be described below.

A liquid crystal device evaluation apparatus of the present invention will be explained with reference to FIG. 1. In FIG. 1, a DC electric field and an AC pulsed electric field are respectively applied to the liquid crystal device 10 by a DC power supply 1 and a pulse generator 2 (or synthesizer). Meanwhile, infrared light from the infrared source 3 is dispersed by a dispersive device 4. Infrared light within a specific wavelength range is extracted through a polarizer 5 and irradiated on the liquid crystal cell 10. The infrared light transmitted through the liquid crystal cell 10 is detected by an MCT detector 6 and converted into an electric signal. The electric signal is amplified by an amplifier 7 and fed into a digital sampling oscilloscope 8. After the electric signal is time-resolved and integrated, a field response curve can be obtained. A specific quantitative change in the field responsive curve is calculated by a computer 9. Based on the calculated quantitative change, the quantitative change as a function of a elapsed time after a DC electric field is removed is obtained. The entire apparatus is controlled by the computer 9.

Note that the DC electric field may be applied to the liquid crystal cell 10 by the pulse generator 2. Alternatively, a combined AC pulsed electric field may be generated by combining pulse sequences different in pulse width by the pulse generator 2. The electric signal converted by the MCT detector 6 is resolved into electric signals corresponding to the individual pulse sequences constituting the combined Al pulsed electric field under control of the computer 9.

In this example, field responsive impurities mixed in the liquid crystal device were evaluated as described below.

As a substrate, glass substrates provided with ITO (indium-tin oxide) transparent electrodes were used. An liquid crystal orientation film made of polyimide was formed on a surface of the substrate. After rubbing treatment, a liquid crystal cell having a cell gap of 10 $\mu$m was formed. On the other hand, as the liquid crystal, ZL1-4792 (manufactured by Merk), which is a representative fluorine-based mixed liquid crystal, was prepared. To this liquid crystal, ethanol serving as the field responsive impurity was mixed in the ratio shown below.

1:1.38x$10^{-3}$ mol/L

2:1.38x$10^{-7}$ mol/L

3:1.38x$10^{-8}$ mol/L

4:1.38x$10^{-9}$ mol/L

5:0 mol/L

The aforementioned liquid crystal materials were separately injected in liquid crystal cells to form Samples 1 to 5. The obtained liquid crystal devices of Samples 1 to 5 were evaluated by the evaluation apparatus shown in FIG. 1.

Figure 2A:
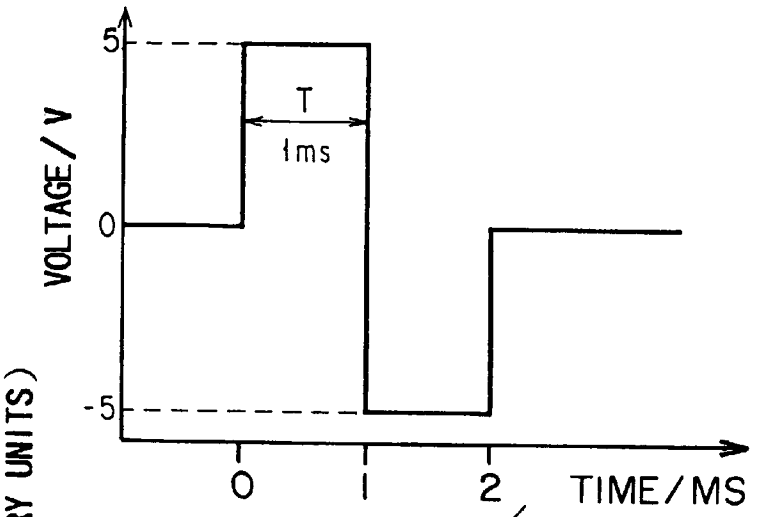
FIGS. 2A and 2B are characteristic graphs respectively showing AC pulse electric field applied according to the method of the present invention and the measured field response curve.
Figure 2B:
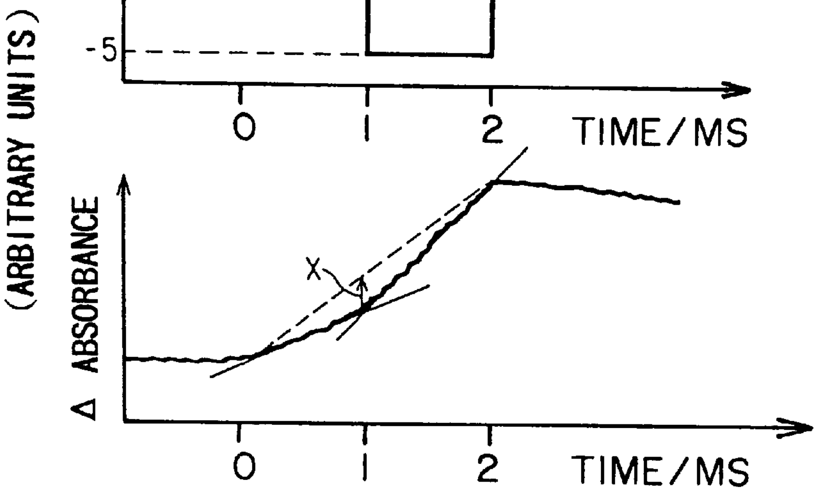

One of electrodes was grounded and the other electrode was set at −10 V. After the DC electric field was applied to the liquid crystal layer for 30 minutes, the DC electric field was removed. Field response curves of the liquid crystal were determined at 30 second intervals, as described below. That is, light from the infrared source was dispersed. While infrared light within an absorption wavelength range containing CH stretching vibration was being irradiated on the liquid crystal device through a polarizer, an AC pulsed electric field having a pulse width of T=1 ms (200 ms cycle), and an amplitude of ±5 V (as shown in FIG. 2A) was applied. Electric signal corresponding to the intensity of light transmitted through the liquid crystal layer was time-resolved and integrated. As a result, a field response curve was obtained corresponding to the time-dependent change in intensity of transmitted light during a cycle of the AC pulsed electric field. A field response curve with respect to Sample 1 determined right after the DC electric field was removed, is shown in FIG. 2B. As shown in FIG. 2B, it was confirmed that the slope of the field response curve is changed before and after the polarity of the AC pulsed electric field is reversed. The slope of the field response curve changed before and after the AC pulsed electric field was reversed with respect to Sample 2 similarly to Sample 1. However, the degree of change was low compared to Sample 1. Whereas, with respect to Samples 3 to 5, significant changes were not observed in the field response curves before and after the polarity of the AC pulsed electric field was reversed.

Figure 3:
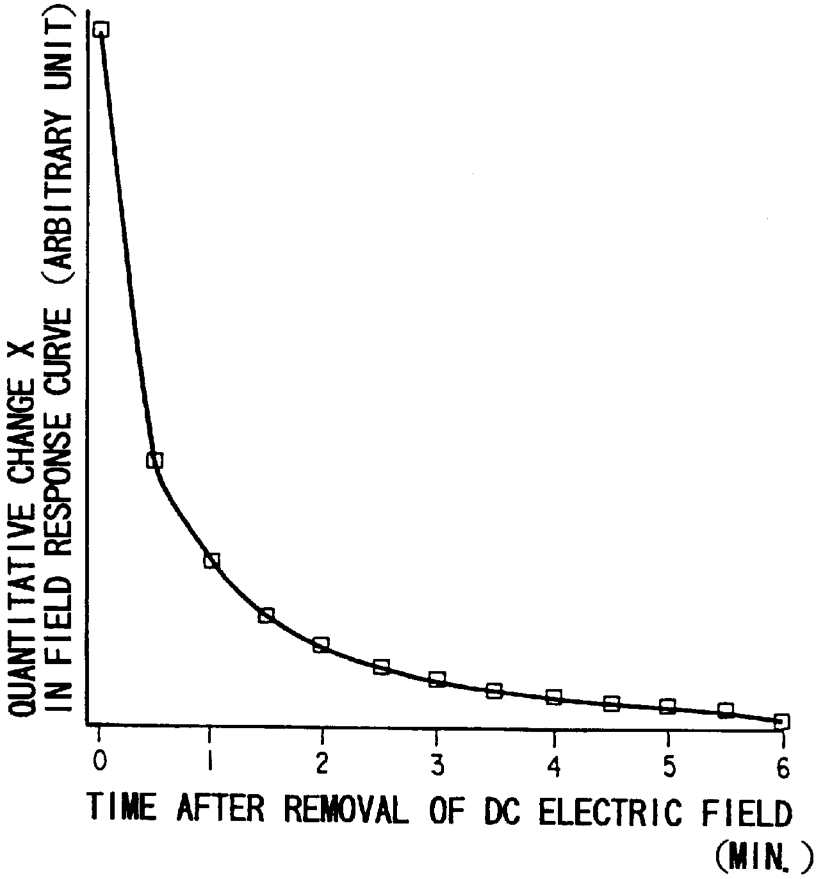
FIG. 3 is a characteristic graph showing change of transmitted light intensity with a passage of time, which is obtained from the field response curve of the liquid crystal cell measured according to the method of the present invention.

However, in both Sample 1 and Sample 2, with a elapsed time after the DC electric field was removed, the change in slope of the field response curve before and after the polarity of the AC pulsed electric field was reversed, gradually reduced. In addition, magnitude of the quantitative change in the intensity of the transmitted light represented by x (difference from the field response curve of Sample 5) in FIG. 2, was reduced. FIG. 3 shows a curve of the quantitative change x in intensity of the transmitted light of Sample 1 with a passage of time after the DC electric field was removed. In this case, the quantitative change in intensity of transmitted light reached zero in about 10 minutes. The time-dependent change curve with respect to Sample 2 (not shown) was located lower than the curve of Sample 1 shown in FIG. 3.

Thereafter, the field response curves were obtained with respect to the liquid crystal devices of Samples 3 and 4 in the same manner as shown above except that application time of the DC electric field was set at 60 minutes. As a result, the field response curve of sample 3 exhibited the same tendency as those of Samples 1 and 2, accompanying the change in the difference x of intensity of transmitted light with a passage of time. Whereas, no significant change was observed in Sample 4 similarly to the case where the DC electric field was applied for 30 minutes.

Since no significant changes were observed in the liquid crystal layers of Samples 4 and 5 which contain no ethanol or a small amount of ethanol, it was demonstrated that field responsive impurities were not contained in the liquid crystal material and the material for the orientation film constituting the liquid crystal device, in excess of a detectable amount. Therefore, it can be concluded that the changes shown in FIGS. 2 and 3 are caused by ethanol mixed in the liquid crystal. These changes were detected as a result that impurities responded to the electric field. Therefore, impurities in these cases are not a neutral molecule, i.e., ethanol, but protons slightly dissociated from ethanol or water contained in ethanol.

From the results measured, it is demonstrated that ethanol can be detected if it is mixed in the liquid crystal (ZL1-4792) in an amount of $1.38\times10^{-7}$ mole/L or more when the DC electric field is applied for 30 minutes. When the DC electric field is applied for 60 minutes, even if the ethanol concentration is lower by one order, it can be detected.

We claim:

1. A method of evaluating a liquid crystal device comprising the steps of:

applying a DC electric field to a liquid crystal device having a liquid crystal layer between a pair of electrodes; and irradiating the liquid crystal device with light within a specific wavelength, while an AC pulsed electric field is being applied to the liquid crystal device after the DC electric field is removed to obtain a field response curve corresponding to a time-dependent change of the light intensity during a cycle of the AC pulsed electric field by time-resolved measurement of light passed through the liquid crystal layer;

wherein impurities mixed in the liquid crystal device are detected on the basis of a specific quantitative change in the field response curve as a function of an elapsed time after the DC electric field is removed.

2. A liquid crystal device evaluation apparatus comprising:

means for applying a DC electric field to a liquid crystal device having a liquid crystal layer between a pair of electrodes;

means for applying an AC pulsed electric field to the liquid crystal device;

means for controlling the AC pulsed electric field so as to be applied after the DC electric field is removed;

a light source for irradiating the liquid crystal layer with light;

spectroscopic means for extracting light within a specific wavelength range from the light radiated from the light source;

light detection means for converting the light within a specific wavelength range passed through the liquid crystal layer into an electric signal after the light is extracted by the spectroscopic means from the light radiated from the light source;

means for obtaining a field response curve corresponding to a time-dependent change in light intensity during a cycle of the AC pulsed electric field by time-resolving and integrating the electric signal converted by the light detection means; and means for calculating a specific quantitative change in the field response curve and analyzing the quantitative change as a function of elapsed time after the DC electric field is removed.

* * * * *